US009438317B2

(12) United States Patent
Karandikar et al.

(10) Patent No.: US 9,438,317 B2
(45) Date of Patent: Sep. 6, 2016

(54) CARD DETECT ARCHITECTURE FOR NEAR FIELD COMMUNICATIONS

(71) Applicants: Niranjan Karandikar, Campbell, CA (US); Timothy F. Cox, Palo Alto, CA (US)

(72) Inventors: Niranjan Karandikar, Campbell, CA (US); Timothy F. Cox, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/576,496

(22) Filed: Dec. 19, 2014

(65) Prior Publication Data

US 2016/0182127 A1    Jun. 23, 2016

(51) Int. Cl.
*H04B 5/00*     (2006.01)
*H04W 4/00*     (2009.01)

(52) U.S. Cl.
CPC ........... *H04B 5/0056* (2013.01); *H04W 4/008* (2013.01)

(58) Field of Classification Search
CPC ........................... H04B 5/0056; H04W 4/008
USPC ....................................... 455/41.1, 41.2, 411
See application file for complete search history.

(56) References Cited

U.S. PATENT DOCUMENTS

| | | | | |
|---|---|---|---|---|
| 7,541,930 B2* | 6/2009 | Saarisalo | ............ | G06K 7/0008 340/10.1 |
| 7,907,057 B2* | 3/2011 | Schaffler | ............ | G06K 7/0008 333/32 |
| 8,233,842 B2* | 7/2012 | Symons | ............ | G06K 19/0723 455/41.1 |
| 8,670,710 B2* | 3/2014 | Miles | ............ | G06K 7/0008 235/492 |
| 8,693,949 B2* | 4/2014 | Royston | ............ | H04W 76/02 327/564 |
| 8,886,124 B2* | 11/2014 | Ohira | ............ | H04M 1/72525 455/41.1 |
| 8,929,808 B2* | 1/2015 | Marholev | ............ | 330/259 |
| 9,042,816 B2* | 5/2015 | Frankland | ............ | G06K 19/0726 455/123 |
| 9,071,282 B1* | 6/2015 | Want | ............ | H04B 5/02 |
| 9,100,773 B2* | 8/2015 | Lambert | ............ | H04W 4/008 |
| 2014/0073241 A1* | 3/2014 | Luong | ............ | H04B 5/00 455/41.1 |
| 2014/0120990 A1* | 5/2014 | Parco | ............ | H04W 52/028 455/574 |
| 2014/0127993 A1* | 5/2014 | Frankland | ............ | G06K 19/0726 455/41.1 |
| 2014/0187154 A1* | 7/2014 | Sabouri | ............ | H04B 5/00 455/41.1 |
| 2014/0370803 A1* | 12/2014 | Haverinen | ............ | H04B 5/0031 455/41.1 |
| 2015/0116296 A1* | 4/2015 | Greene | ............ | G09G 3/20 345/211 |

* cited by examiner

*Primary Examiner* — Marceau Milord
(74) *Attorney, Agent, or Firm* — Forefront IP Lawgroup, PLLC

(57) ABSTRACT

Described herein are architectures, platforms and methods for detecting near field communication (NFC) cards/tags by a NFC enabled device, using a coupled impedance signature unique to the NFC cards/tags and the NFC enabled device.

20 Claims, 5 Drawing Sheets

CARD DETECT ARCHITECTURE FOR NEAR FIELD COMMUNICATIONS

BACKGROUND

In systems and devices implementing near field communication (NFC), an NFC reader/writer device may communicate with several NFC enabled cards/tags. Such NFC cards/tags may be passive, meaning that they have no power. In a typical implementation, the NFC reader/writer device attempts to poll or determine which NFC cards/tags are within its environment.

An antenna of the NFC reader/writer device may emit a radio frequency (RF) field. When a passive NFC card/tag is brought into the RF field of the NFC reader/writer device, the passive NFC card/tag receives power and begins communications with the NFC reader/writer device.

Before such communication is established between the NFC reader/writer device and the passive NFC card/tag, the NFC reader/writer device detects the presence of the passive NFC card/tag. Typically, detecting the presence of the passive NFC card/tag may be performed by the NFC reader/writer device emitting the RF field continuously, or in order to save power, emitting the RF field for a short duration of time. A change in voltage level may be seen at an antenna and/or transmitter pins of the NFC reader/writer device. This change of voltage level may be indicative of the presence of a passive NFC card/tag.

Several issues exist with the typical detection of a NFC card/tag. Although, the RF field may be emitted in short durations, a power amplifier providing the necessary energy may have to emit maximum power during transmission of the RF field. The maximum power is used to power a passive NFC card/tag. This may result in higher power dissipation by the NFC reader/writer device.

Another issue may be false indications. When voltage levels change at transmitter pins or an antenna of the NFC reader/writer device, this may indicate the presence of an NFC card/tag. When a metallic or magnetic object that is a non NFC card/tag enters the emitted RF field of the NFC reader/writer device, the voltage levels at the transmitter pins or antenna of the NFC reader/writer device change, and the NFC reader/writer device may falsely recognize the object as a valid NFC card/tag.

BRIEF DESCRIPTION OF THE DRAWINGS

The detailed description is described with reference to accompanying figures. In the figures, the left-most digit(s) of a reference number identifies the figure in which the reference number first appears. The same numbers are used throughout the drawings to reference like features and components.

DETAILED DESCRIPTION

Described herein are architectures, platforms and methods for using a unique coupled impedance signature to recognize the presence of a near field communication (NFC) card/tag by a NFC reader/writer device. The described techniques detect a change in impedance when an NFC card/tag is bought near a NFC reader/writer antenna, and does not require the NFC card/tag to be powered. False indications may be avoided, since other metallic or magnetic objects do not produce the unique coupled impedance signature.

Figure 1:
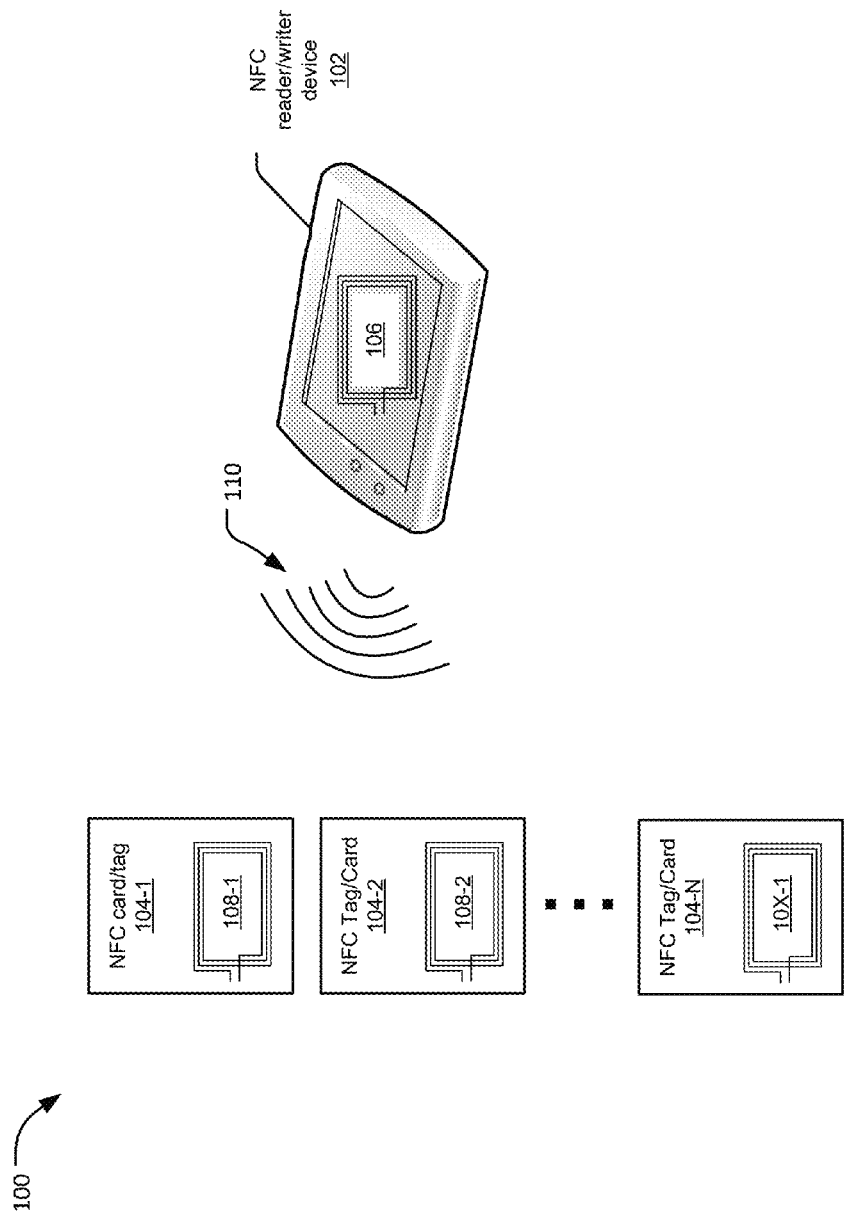
FIG. 1 is an example scenario illustrating a near field communication (NFC) card/tag detection as described in implementations herein.

FIG. 1 is an example scenario 100 that illustrates a near field communication (NFC) reader/writer device 102 communicating with one or more NFC cards/tags 104. The NFC cards/tags 104 may be passive or active (i.e., not powered or powered). The NFC reader/writer device 102 includes an antenna 106, which may be part of or connected to a NFC module (not shown).

The NFC cards/tags 104 include respective antennas 108. The antenna 106 of NFC reader/writer device 102 transmits an RF field 110. As a NFC card/tag 104 enters the RF field 110, a coupled impedance signature is created by the impedance of antenna 106 of NFC reader/writer device 102 and antenna 108 of NFC card/tag 104. The coupled impedance signature specifically identifies that an NFC card/tag 104 is in proximity to the NFC reader/writer device 102.

Although other metallic or magnetic objects may enter the RF field 110 and create coupled impedance, the coupled impedance between such objects and the NFC reader/writer device 102 is not the same as the coupled impedance of a NFC card/tag 104 and the NFC reader/writer device 102. Therefore, based on the coupled impedance signature, false identifications of NFC cards/tags may be avoided. Furthermore, since impedance coupling between antenna 106 and antenna 108 is passive, minimal power is needed to determine the coupled impedance signature. NFC card/tag 104 need not be turned on to be recognized by the NFC reader/writer device 102.

Figure 2:
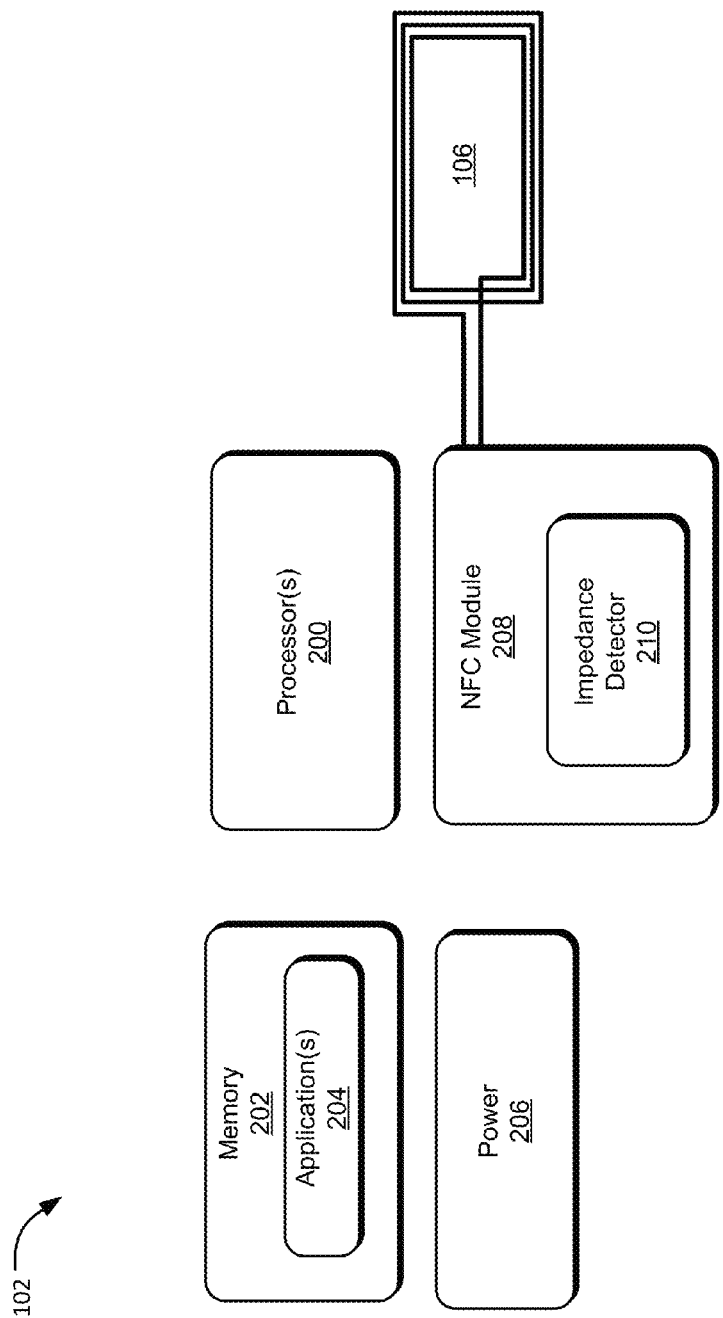
FIG. 2 is an example block diagram of a near field communication (NFC) reader/writer device that detects NFC cards/tags using a coupled impedance signature as described in implementations herein.

FIG. 2 shows an example NFC reader/writer device 102 that detects NFC cards/tags 104 using a coupled impedance signature. The NFC reader/writer device 102 may include, but are not limited to, a tablet computer, a netbook, a notebook computer, a laptop computer, mobile phone, a cellular phone, a smartphone, a personal digital assistant, a multimedia playback device, a digital music player, a digital video player, a navigational device, a digital camera, and the like. Furthermore, the NFC reader/writer device 102 may include, but is not limited to, non-portable devices such as a personal computer, nor limited to wireless devices such as when connected through a cable.

The NFC reader/writer device 102 includes one or more processors 200, and memory 202 coupled to the one or more processors. Memory 202 can be non-transitory memory/media that includes various types of storage, including read only, random access and the like. Memory 202 may also include programming/non-programmable firmware. Particular elements described herein as hardware may be implanted as firmware as part of memory 202. Memory 202 may particularly include applications 204 which may be NFC enabled software/firmware applications.

The NFC reader/writer device 102 may include a power component 206. Power component 206 may include various AC and/or DC elements, such as batteries. Power component 206 drives and provides power to various other components of NFC reader/writer device 102, including power amplifiers.

The NFC reader/writer device 102 may include an NFC controller or module 208. The NFC module 208 is used to communicate with other NFC enabled devices, including the NFC card/tag 104. The NFC module is connected to the antenna 106. In this implementation the NFC module includes an impedance detector 210 used to detect the coupled impedance signature.

Figure 3:
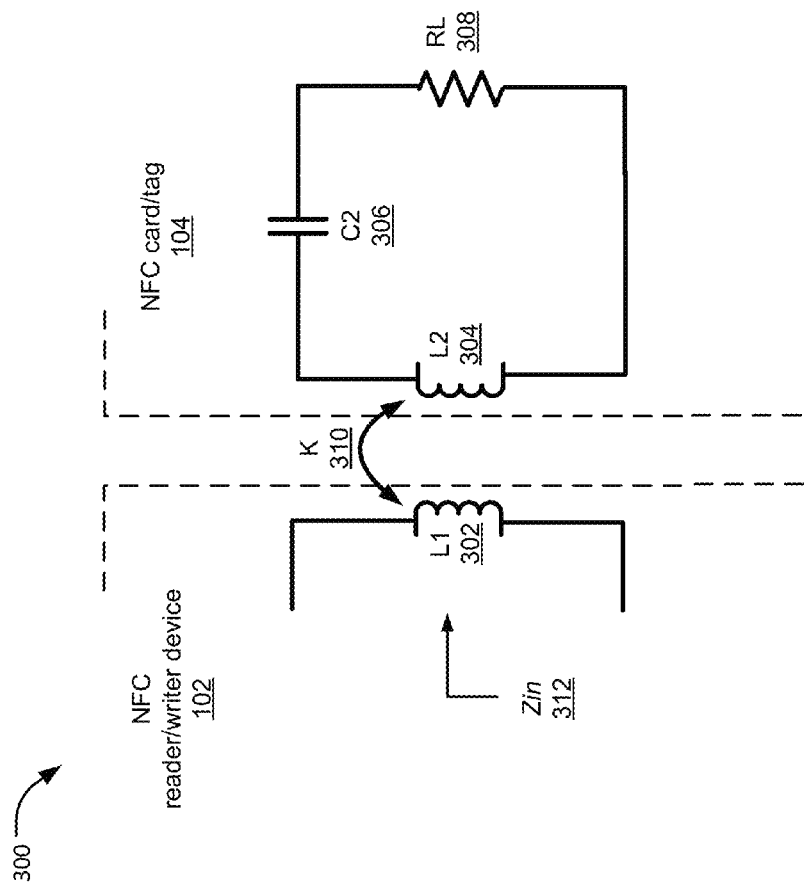
FIG. 3 is an example coupled coil system between a near field communication (NFC) reader/writer device and NFC card/tag as described in present implementations herein.

FIG. 3 shows an example coupled coil system 300 between NFC reader/writer device 102 and NFC card/tag 104. A coupled impedance signature that is unique to resonant coils is used to avoid false detection. Change in impedance is measure by an impedance bridge that consumes very low power compared to the use of power amplifiers. A power amplifier (not shown) used for transmission may only need to be turned on when actual transmission occurs between the NFC reader/writer device 102 and NFC card/tag 104.

In this example, inductor L1 302 represents the antenna 106 of NFC reader/writer device 102. An equivalent circuit of NFC card/tag 104 is represented by inductor L2 304, capacitor C2 306, and resistor RL 308. Inductor L2 304 may be considered as the antenna 108 of NFC card/tag 104. The capacitor C2 306 may be used to tune the antenna 108 (i.e., inductor L2 304) to a frequency of about 13.56 MHz, the operating frequency of NFC communication. RL 308 represents a load on the antenna 108 (i.e., inductor L2 304) of NFC card/tag 104.

Coupling between the two antennas 106 and 108 (i.e., inductors 302 and 304) is represented by coupling coefficient K 310. Zin 312 is the input impedance and is derived by following Equation 1.

$$Zin = Z1 + \frac{\omega^2 K^2 L1 L2}{RL} \qquad \text{Equation 1}$$

For NFC cards/tags 104 that implement a parallel tuned configuration, Zin 312 may be derived by the following Equation 2.

$$Z_{in} = K^2 \frac{L1 \cdot RL}{L2} + (1 - K^2) Z1 \qquad \text{Equation 2}$$

Z1 is the impedance of the antenna 106 (i.e., inductor L1 300). Equations 1 and 2 illustrate that input impedance Zin 312 increases as the coupling coefficient K 310 increases between the two antennas 106 and 108 (i.e., inductors 302 and 304), which translates to a decrease in distance between the two antennas 106 and 108 (i.e., inductors 302 and 304). Therefore, a particular coupling impedance signature unique to the NFC reader/writer device 102 and NFC card/tag 104 may be determined.

Figure 4:
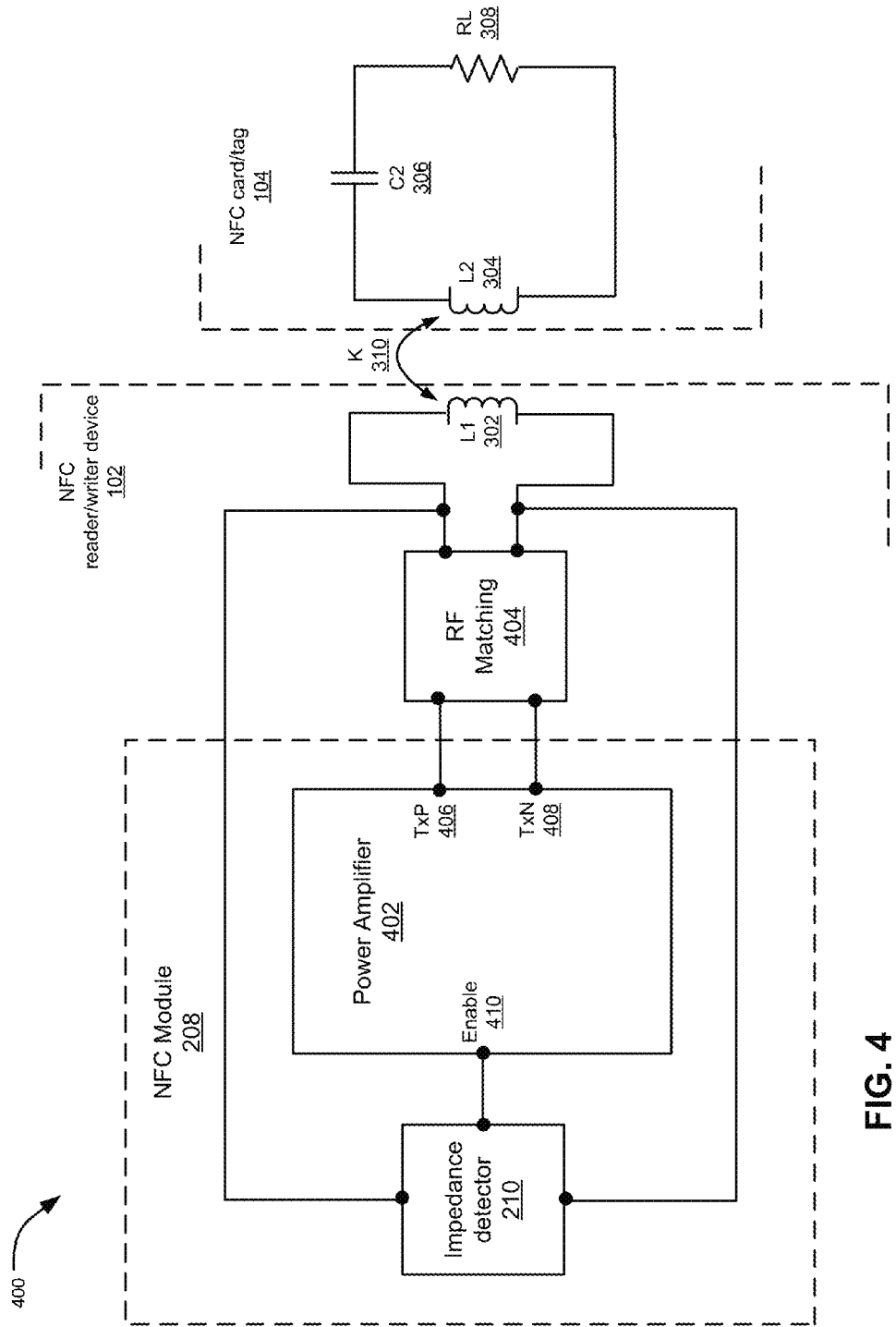
FIG. 4 is an example near field communication (NFC) card detection architecture of an NFC reader/writer device and NFC card/tag as described in present implementations herein.

FIG. 4 shows an example NFC card/tag detection architecture 400. The NFC controller/module 208 may include a power amplifier 402. The NFC controller/module 208 may be integrated as part of a system on a chip (SOC). The power amplifier 402 supplies power to the antenna 106 (i.e., inductor L1 300). In certain implementations, other energy sources may be used in place of the power amplifier 402. An RF matching network 404 matches impedance of antenna 106 (i.e., inductor L1 300) to the output impedance of power amplifier 402. The RF matching network 404 is connected to the power amplifier by connection TxP 406 and TxN 408.

When a card or tag (i.e., NFC card/tag 104) is not in the vicinity of NFC reader/writer device 102 antenna 106 (i.e., inductor L1 300), the power amplifier 402 is turned off. When the card or tag (i.e., NFC card/tag 104) comes near the NFC reader/writer device 102 antenna 106 (i.e., inductor L1 300), the input impedance Zin 310 goes up. This change in impedance is then detected by the impedance detector 210. As the impedance approaches a predetermined threshold, or the coupled impedance signature, the power amplifier 402 is turned on. The impedance detector 210 turns on the power amplifier 402 through enable connection 410, and establishing communication between NFC reader/writer device 102 and NFC card/tag 104. A polling sequence may be initiated by the NFC reader/writer device 102 and NFC card/tag 104.

Figure 5:
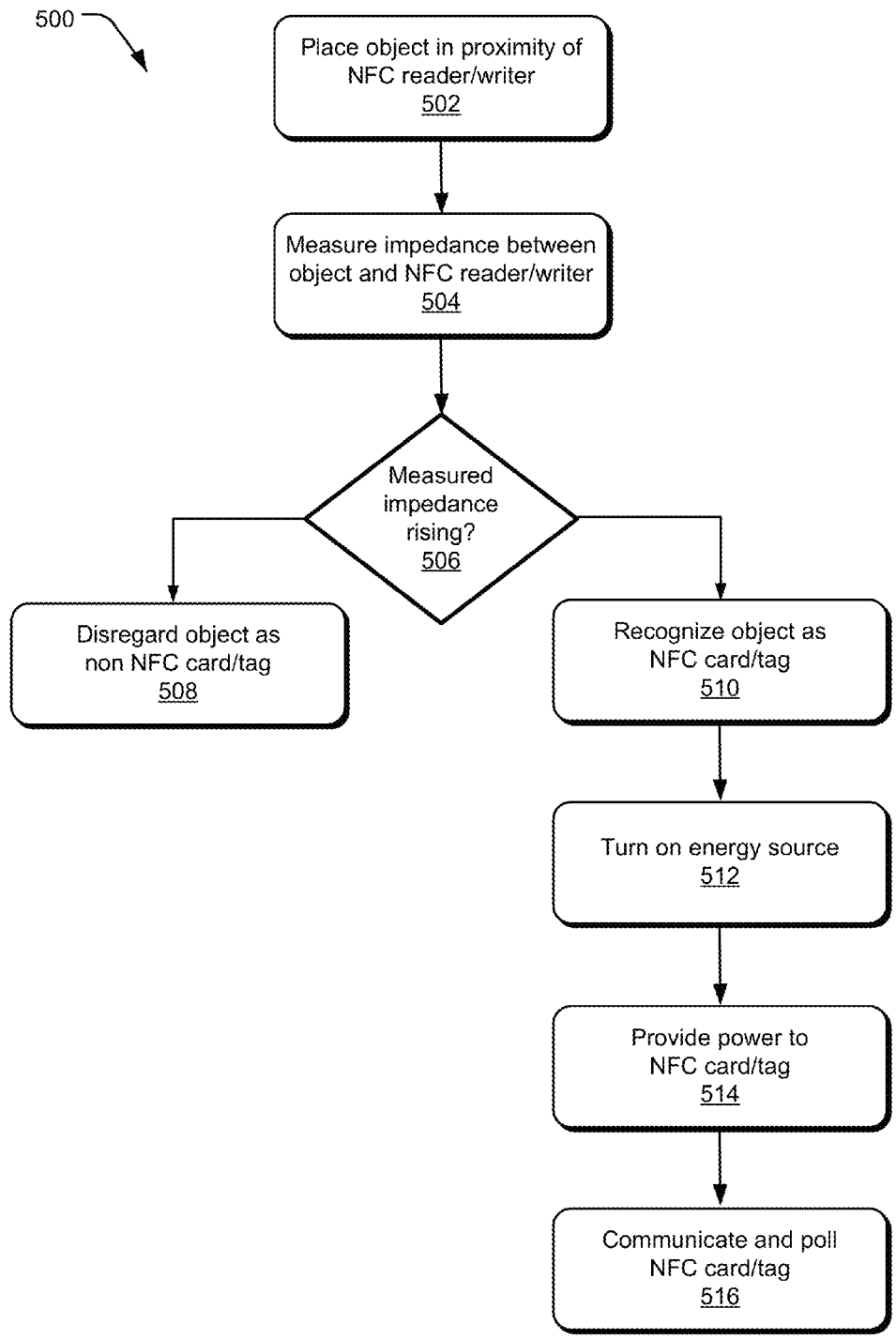
FIG. 5 is an example flow chart illustrating an example method for detection of a near field communication (NFC) card/tag by an NFC reader/writer device.

FIG. 5 shows an example process chart 500 illustrating an example method for detecting a near field communication (NFC) card/tag by a NFC reader/writer. The order in which the method is described is not intended to be construed as a limitation, and any number of the described method blocks can be combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention.

At block 502, placing an object near an NFC reader/writer is performed. At this point, it is not determined if the object is an NFC card/tag or not.

At block 504, measuring impedance between the object and NFC reader/writer device is performed. Minimal energy is transmitted from the NFC reader/writer device.

If the measured impedance value is not determined to be rising or approaching a threshold value or a coupled impedance signature, following the NO branch of block 506, at block 508, the object is disregarded as a non NFC card/tag.

If the measured impedance value is determined to be rising or approaching a threshold value or a coupled impedance signature, following the YES branch of block 506, at block 510, the object is recognized as a NFC card/tag.

At block 512, turning on power amplifier or similar component (energy source), is performed.

At block 514, power is provided to the NFC card/tag. In particular, power is provide to a passive or non-powered NFC card/tag.

At block 516, communicating and polling is performed between the NFC reader/writer and the NFC card/tag.

The following examples pertain to further embodiments:

In Example 1, a near field communication (NFC) device comprising: an antenna; an NFC controller comprising: an impedance detector configured to detect rising impedance at the antenna if an object is placed near the antenna; and an energy source configured to be turned on by the impedance detector if the impedance detector detects the rising impedance.

Example 2 is the NFC device of Example 1, wherein the antenna is configured to communicate and poll the object if the energy source is turned on.

Example 3 is the NFC device of Example 1, wherein the antenna is formed by an inductor.

Example 4 is the NFC device of Example 1, wherein the object comprises an inductor that creates a coupling with the antenna of the NFC device.

Example 5 is the NFC device of Example 1, wherein the energy source is a power amplifier.

Example 6 is the NFC device of any of Examples 1 to 5, wherein the NFC controller is part of a system on a chip.

Example 7 is the NFC device of any of Examples 1 to 5, wherein the rising impedance approaches a threshold coupling impedance signature value.

Example 8 is the NFC device of any of Examples 1 to 5, wherein the impedance detector measure input impedance Zin at the antenna to detect rising impedance.

Example 9 is the NFC device of any of Examples 1 to 5 further comprising an RF matching network that matches impedance of the antenna to an output impedance of the energy source.

In Example 10, a near field communication (NFC) module comprising: an impedance detector configured to detect impedance at an antenna of a NFC device; and a power amplifier configured to turn on and provide power to an NFC card if the NFC card is placed in proximity of the antenna and the impedance detector detects a rising coupling impedance between the antenna and the NFC card.

Example 11 is the NFC module of Example 10, wherein the impedance detector is configured to detect rising impedance at the antenna and compare to measured impedance to a threshold value.

Example 12 is the NFC module of Example 10, wherein the rising coupling impedance approaches a threshold coupling impedance signature value.

Example 13 is the NFC module of Example 10, wherein the antenna is formed by an inductor and impedance is determined by a coupling of a second inductor at the NFC card.

Example 14 is the NFC module of Example 10, wherein the power amplifier is configured to provide polling and communicating through the antenna.

Example 15 is the NFC module of Example 10, wherein the NFC module is configured to an RF matching network that matches impedance of the antenna to an output impedance of power amplifier.

Example 16 is the NFC module in any of Examples 10 to 15, wherein the NFC module is part of a system on a chip (SOC).

In Example 17, a method of detecting a near field communication (NFC) card comprising: measuring impedance between an object and an NFC enabled device; determining if the impedance is rising; powering an energy source to transmit power to the object if the impedance is determined to be rising; and communicating with the object.

Example 18 is the method of Example 17, wherein the measuring is between an antenna of the object and an antenna of the NFC enabled device.

Example 19 is the method of Example 17, wherein the determining includes determining a threshold coupling impedance.

Example 20 is the method of any of Examples 17 to 19, wherein the communicating includes polling the object.

What is claimed is:

1. A near field communication (NFC) device comprising:
an antenna;
an NFC controller comprising:
an impedance detector configured to detect rising impedance at the antenna if an object is placed near the antenna; and
an energy source configured to be turned on by the impedance detector if the impedance detector detects the rising impedance.

2. The NFC device of claim 1, wherein the antenna is configured to communicate and poll the object if the energy source is turned on.

3. The NFC device of claim 1, wherein the antenna is formed by an inductor.

4. The NFC device of claim 1, wherein the object comprises an inductor that creates a coupling with the antenna of the NFC device.

5. The NFC device of claim 1, wherein the rising impedance approaches a threshold coupling impedance signature value.

6. The NFC device of claim 1, wherein the impedance detector measure input impedance Zin at the antenna to detect rising impedance.

7. The NFC device of claim 1, wherein the energy source is a power amplifier.

8. The NFC device of claim 1, wherein the NFC controller is part of a system on a chip.

9. The NFC device of claim 1 further comprising an RF matching network that matches impedance of the antenna to an output impedance of the energy source.

10. A near field communication (NFC) module comprising:
an impedance detector configured to detect impedance at an antenna of a NFC device; and
a power amplifier configured to turn on and provide power to an NFC card if the NFC card is placed in proximity of the antenna and the impedance detector detects a rising coupling impedance between the antenna and the NFC card.

11. The NFC module of claim 10, wherein the impedance detector is configured to detect rising impedance at the antenna and compare to measured impedance to a threshold value.

12. The NFC module of claim 10, wherein the rising coupling impedance approaches a threshold coupling impedance signature value.

13. The NFC module of claim 10, wherein the antenna is a formed by an inductor and impedance is determined by a coupling of a second inductor at the NFC card.

14. The NFC module of claim 10, wherein the power amplifier is configured to provide polling and communicating through the antenna.

15. The NFC module of claim 10, wherein the NFC module is configured to an RF matching network that matches impedance of the antenna to an output impedance of power amplifier.

16. The NFC module of claim 10, wherein the NFC module is part of a system on a chip (SOC).

17. A method of detecting a near field communication (NFC) card comprising:
measuring impedance between an object and an NFC enabled device;
determining if the impedance is rising;
powering an energy source to transmit power to the object if the impedance is determined to be rising; and
communicating with the object.

18. The method of claim 17, wherein the measuring is between an antenna of the object and an antenna of the NFC enabled device.

19. The method of claim 17, wherein the determining includes determining a threshold coupling impedance.

20. The method of claim 17, wherein the communicating includes polling the object.

* * * * *